(12) United States Patent
Ye

(10) Patent No.: US 11,005,068 B1
(45) Date of Patent: May 11, 2021

(54) ORGANIC LIGHT-EMITTING DIODE TOUCH DISPLAY AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

(*) Notice: Subject to any disclaimer, the term of this patent is extended or adjusted under 35 U.S.C. 154(b) by 282 days.

(21) Appl. No.: 16/332,792

(22) PCT Filed: Dec. 14, 2018

(86) PCT No.: PCT/CN2018/121000
§ 371 (c)(1),
(2) Date: Mar. 13, 2019

(87) PCT Pub. No.: WO2020/113650
PCT Pub. Date: Jun. 11, 2020

(30) Foreign Application Priority Data

Dec. 7, 2018 (CN) .......................... 201811497463.8

(51) Int. Cl.
*H01L 51/52* (2006.01)
*H01L 27/32* (2006.01)
*H01L 51/56* (2006.01)

(52) U.S. Cl.
CPC ........ *H01L 51/5253* (2013.01); *H01L 27/323* (2013.01); *H01L 27/3258* (2013.01); *H01L 51/5209* (2013.01); *H01L 51/5225* (2013.01); *H01L 51/56* (2013.01)

(58) Field of Classification Search
CPC ............ H01L 51/5253; H01L 51/5209; H01L 51/5225; H01L 51/56; H01L 27/323; H01L 27/3258
See application file for complete search history.

(56) References Cited

U.S. PATENT DOCUMENTS

| 10,312,228 | B2* | 6/2019 | Chen | H01L 27/016 |
| 2010/0013745 | A1* | 1/2010 | Kim | H01L 27/3244 345/76 |
| 2010/0110041 | A1* | 5/2010 | Jang | G06F 3/0443 345/174 |
| 2014/0027724 | A1* | 1/2014 | Lim | H01L 27/322 257/40 |
| 2014/0175399 | A1* | 6/2014 | Choi | H01L 51/56 257/40 |

(Continued)

*Primary Examiner* — Lex H Malsawma

(57) ABSTRACT

An organic light-emitting diode (OLED) touch display and a manufacturing method thereof are provided. An organic protective layer of a touch functional layer of the OLED touch display of the present disclosure has protuberances corresponding to an illuminated pixel region, which can effectively improve an optical coupling output rate of the OLED device. The touch functional layer adopts a structure in which an inorganic insulating layer and the organic protective layer which are formed layer-by-layer, and the material and structure of which are similar to a thin film encapsulation film layer, so the touch functional layer also functions as a film encapsulation layer. It is beneficial to block the penetration of water and oxygen, reduce a risk of corrosion damage of OLED light-emitting devices, and improve a lifespan of the OLED device.

10 Claims, 6 Drawing Sheets

(56) References Cited

U.S. PATENT DOCUMENTS

| | | | |
|---|---|---|---|
| 2016/0195983 A1* | 7/2016 | Miyake | G06F 3/04164 345/174 |
| 2018/0108710 A1* | 4/2018 | Lin | H01L 27/323 |
| 2018/0123074 A1* | 5/2018 | Lee | H01L 27/323 |
| 2019/0341428 A1* | 11/2019 | Lee | H01L 27/3276 |

* cited by examiner

ORGANIC LIGHT-EMITTING DIODE TOUCH DISPLAY AND MANUFACTURING METHOD THEREOF

FIELD OF DISCLOSURE

The present disclosure relates to the field of touch display technologies, and in particular, to an organic light-emitting diode (OLED) touch display and a method for manufacturing the same.

BACKGROUND

In flat panel display technology, organic light-emitting diode (OLED) displays have many advantages such as being light, being thin, active illumination, fast response times, wide viewing angles, wide color gamut, high brightness, low power consumption, and so on. The OLED displays are gradually becoming a third generation display technology after liquid crystal displays. In comparison with liquid crystal displays (LCDs), OLEDs have advantages of lower power consumption, being thinner, and wider viewing angles, which are incomparable to LCDs. At present, people are increasingly demanding fineness (i.e., resolution) of display, but production of high-quality and high-resolution OLED displays still faces many challenges.

Although OLED displays have many advantages, they also have their own shortcomings. Low photon utilization efficiency is one of the shortcomings. Due to influence of indium tin oxide (ITO) and a glass substrate, and reflection and refraction of various functional layers inside an OLED device, about 70% of photons cannot escape into air, resulting in low photon utilization efficiency. In order to improve light extraction efficiency of the device, researchers have proposed many methods, such as changing a structure of electrodes of the device, inserting a light extraction layer inside the OLED, or etching to form various microstructures on a surface of the substrate. These methods can improve the light extraction efficiency of the OLED to some extent, but processes are complicated, and difficult to be realized in practical applications, and changing an internal structure or etching easily affects performance of the OLED itself. For this reason, how to improve the light extraction and optical coupling output of OLED devices have become an important topic in OLED structure design.

With development of portable electronic display devices, touch panels provide a new human-computer interaction interface, which is more direct and more user-friendly in use. A touch screen is integrated with a flat display device to form a touch display device. The device can make the flat display device have a touch function, and can perform input through a finger, a stylus, etc., and the operation is more intuitive and simple.

At present, commonly used touch technologies include out-cell touch technology and in-cell touch technology. Taking a liquid crystal panel as an example, the out-cell touch technology is to embed a touch screen between a color filter substrate and a polarizer of a display screen. That is, the technology is equipped with a touch sensor on the liquid crystal panel, which is much less difficult than the in-cell touch technology.

In a development of the existing out-cell OLED touch display technology, the touch sensor is generally formed on an OLED layer. The specific process is as follows: first, a TFT layer including a substrate is formed, and then the OLED layer is formed on the TFT layer. An encapsulation layer is formed on the OLED layer, and finally a touch functional layer is formed on the encapsulation layer. The touch functional layer generally includes a first insulating layer, a bridge layer, a second insulating layer, an electrode circuit layer, and an organic protective layer arranged in a sequence from bottom to top. The bridge layer includes a plurality of metal bridges in a pixel area, and the electrode circuit layer includes a touch driving electrode (Tx) and a touch sensing electrode (Rx). The touch driving electrode or the touch sensing electrode passes through contacting holes of the second insulating layer, and is connected to the metal bridges.

At present, a conductive layer of the touch panel is mainly formed by vacuum coating with indium tin oxide compounds, and patterning by an etching process, so as to form it on an insulating substrate, which not only has high requirements on processes and equipment, but also wastes a large amount of indium tin oxide compound materials in etching, and produces a large amount of industrial waste liquid containing heavy metals. Also, indium tin oxide (In) is a rare resource, resulting in higher cost of the touch panel. In order to effectively reduce the cost of the touch panel and meet market trends in thin and light consumer electronics products, a metal mesh touch panel (metal mesh TP) technology has been developed in recent years, in which a conductive layer of a sensing layer is replaced with an indium tin oxide compound by a metal grid to form a touch electrode. Compared to using indium tin oxide (ITO) as touch electrode material of the touch panel, the metal grid has good electrical performance and low square resistance, and can be applied to large-sized touch display products.

SUMMARY OF DISCLOSURE

An object of the present disclosure is to provide an organic light-emitting diode (OLED) touch display, which can improve an optical coupling output rate, and block penetration of water and oxygen, and reduce a risk of corrosion damage of the OLED light-emitting device, and improve a lifespan of the OLED device.

Another object of the present disclosure is to provide a manufacturing method of an OLED touch display, which can improve an optical coupling output rate, and block penetration of water and oxygen, and reduce a risk of corrosion damage of the OLED light-emitting device, and improve a lifespan of the OLED device.

In order to achieve the above objects, the present disclosure provides an OLED touch display, including: a substrate, a thin film transistor (TFT) layer, an OLED luminous layer, an encapsulation layer, and a touch functional layer, which are sequentially formed on the substrate;

the touch functional layer includes a first inorganic insulating layer disposed on the encapsulation layer, a metal bridge layer disposed on the first inorganic insulating layer, a second inorganic insulating layer disposed on the first inorganic insulating layer and covering the metal bridge layer, a metal mesh layer disposed on the second inorganic insulating layer, and an organic protective layer disposed on the second inorganic insulating layer and covering the metal mesh layer;

the OLED luminous layer has a pixel spacing region and illuminated pixel regions separated by the pixel spacing region;

the metal bridge layer and the metal mesh layer are correspondingly located above the pixel spacing region; and the first inorganic insulating layer and the second inorganic insulating layer together form an inorganic insulating layer, and a surface of the inorganic insulating layer contacting the organic protective layer has a plurality of recesses which are correspondingly formed above the illuminated pixel regions, the organic protective layer fills the plurality of recesses on the second inorganic insulating layer, and a surface of the organic protective layer contacting the second inorganic insulating layer has a plurality of protuberances, where the plurality of protuberances are correspondingly embedded in the plurality of recesses.

Alternatively, a depth of one of the recesses is less than a thickness of the second inorganic insulating layer, and the one of the recesses is disposed in the second inorganic insulating layer.

Alternatively, a depth of one of the recesses is greater than a thickness of the second inorganic insulating layer, and the one of the recesses extends through the second inorganic insulating layer and extends to the first inorganic insulating layer.

The encapsulation layer includes an inorganic barrier layer and an organic buffer layer which are formed layer-by-layer.

Material of the organic protective layer is the same as material of the organic buffer layer.

The material of the organic protective layer includes at least one of acrylic acid, hexamethyldisiloxane, acrylate, polycarbonate, and polystyrene.

The metal mesh layer includes a plurality of first electrodes and a plurality of second electrodes alternatively disposed with the plurality of first electrodes, each of the first electrodes is disconnected from each of the second electrodes at a staggered position of one of the first electrodes and one of the second electrodes on the second inorganic insulating layer;

The metal bridge layer includes a plurality of metal bridges which correspond to a position below the staggered position of the first electrode and the second electrode.

The second inorganic insulating layer is provided with contacting holes above two ends of each of the metal bridges.

One of the first electrodes is connected to one of the metal bridges through one of the contacting holes, and each of the first electrodes interrupted on the second inorganic insulating layer is connected to one another by the metal bridges.

The present disclosure also provides a manufacturing method of an organic light-emitting diode (OLED) touch display, including:

in a step S1, providing a substrate, and sequentially forming a thin film transistor (TFT) layer, an OLED luminous layer, and an encapsulation layer on the substrate, where the OLED luminous layer has a pixel spacing region and illuminated pixel regions separated by the pixel spacing region;

in a step S2, depositing a first inorganic insulating layer on the encapsulation layer;

in a step S3, depositing and patterning a metal bridge layer on the first inorganic insulating layer;

in a step S4, depositing a second inorganic insulating layer covering the metal bridge layer on the first inorganic insulating layer, where the first inorganic insulating layer and the second inorganic insulating layer together form an inorganic insulating layer;

in a step S5, patterning the inorganic insulating layer, and forming a plurality of recesses on a surface of the inorganic insulating layer and corresponding to the illuminated pixel regions;

in a step S6, depositing and patterning a metal mesh layer on the second inorganic insulating layer, where the metal mesh layer is correspondingly located above the pixel spacing region; and in a step S7, forming an organic protective layer covering the metal mesh layer on the second inorganic insulating layer, where the organic protective layer fills the plurality of recesses on the inorganic insulating layer, so that the organic protective layer forms a plurality of protuberances on a surface in contact with the second inorganic insulating layer, and the plurality of protuberances are correspondingly embedded in the plurality of recesses.

Alternatively, in the step S5, a depth of one of the recesses is less than a thickness of the second inorganic insulating layer, and the one of the recesses is disposed in the second inorganic insulating layer.

Alternatively, in the step S5, a depth of one of the recesses is greater than a thickness of the second inorganic insulating layer, and the one of the recesses extends through the second inorganic insulating layer and extends to the first inorganic insulating layer.

In the step S1, the encapsulation layer includes an inorganic barrier layer and an organic buffer layer which are formed layer-by-layer.

In the step S7, material of the organic protective layer is the same as material of the organic buffer layer.

The material of the organic protective layer includes at least one of acrylic acid, hexamethyldisiloxane, acrylate, polycarbonate, and polystyrene.

In the step S3, the metal bridge layer includes a plurality of metal bridges.

In the step S5, the method further includes forming contacting holes passing through the second inorganic insulating layer above two ends of each of the metal bridges.

In the step S6, the metal mesh layer includes a plurality of first electrodes and a plurality of second electrodes alternatively disposed with the plurality of first electrodes, each of the first electrodes is disconnected from each of the second electrodes at a staggered position of one of the first electrodes and one of the second electrodes on the second inorganic insulating layer.

The metal bridges correspond to a position below the staggered position of the first electrode and the second electrode.

One of the first electrodes is connected to one of the metal bridges through one of the contacting holes, and each of the first electrodes interrupted on the second inorganic insulating layer is connected to one another by the metal bridges.

Advantages of the present disclosure are as follows. The OLED touch display of the present disclosure includes a substrate and a TFT layer, an OLED luminous layer, an encapsulation layer, and a touch functional layer which are sequentially formed on the substrate. The touch functional layer includes a first inorganic insulating layer, a metal bridge layer, a second inorganic insulating layer, a metal mesh layer, and an organic protective layer. The first inorganic insulating layer and the second inorganic insulating layer together form an inorganic insulating layer. A surface of the inorganic insulating layer contacting the organic protective layer has a plurality of recesses which are correspondingly formed above the illuminated pixel regions. A surface of the organic protective layer contacting the second inorganic insulating layer has a plurality of protuberances, where the plurality of protuberances are correspondingly embedded in the plurality of recesses. The touch functional layer adopts a metal mesh electrode structure, and the metal bridge layer and the metal mesh layer are correspondingly located above the pixel spacing region. The organic protective layer has protuberances which are correspondingly formed above the illuminated pixel regions, and can effectively improve an optical coupling output rate of the OLED device. Moreover, the touch functional layer adopts a structure in which the inorganic insulating layer and the organic protective layer are formed layer-by-layer, and the material and structure of which are similar to a thin film encapsulation (TFE) film layer, so the touch functional layer also functions as a film encapsulation layer. It is beneficial to block the penetration of water and oxygen, reduce a risk of corrosion damage of OLED light-emitting devices, and improve a lifespan of the OLED device. By the manufacturing method of the OLED touch display of the present disclosure, it is beneficial to improve an optical coupling output rate, block the penetration of water and oxygen, reduce a risk of corrosion damage of OLED light-emitting devices, and improve a lifespan of the OLED device.

For a better understanding of features and technical aspects of the present disclosure, please refer to the following detailed description of the present disclosure and the accompanying drawings, but the drawings are only provided for reference and description, and are not intended to limit the present disclosure.

BRIEF DESCRIPTION OF DRAWINGS

The accompanying drawings, which are incorporated in and constitute a part of this specification, illustrate several implementations of the present disclosure and, together with the description, serve to explain the advantages and principles of the present disclosure.

In the drawings.

DETAILED DESCRIPTION

The technical means adopted by the present disclosure to achieve the above and other objects can be best understood by referring to the following detailed description of the preferred embodiments and the accompanying drawings.

Figure 1:
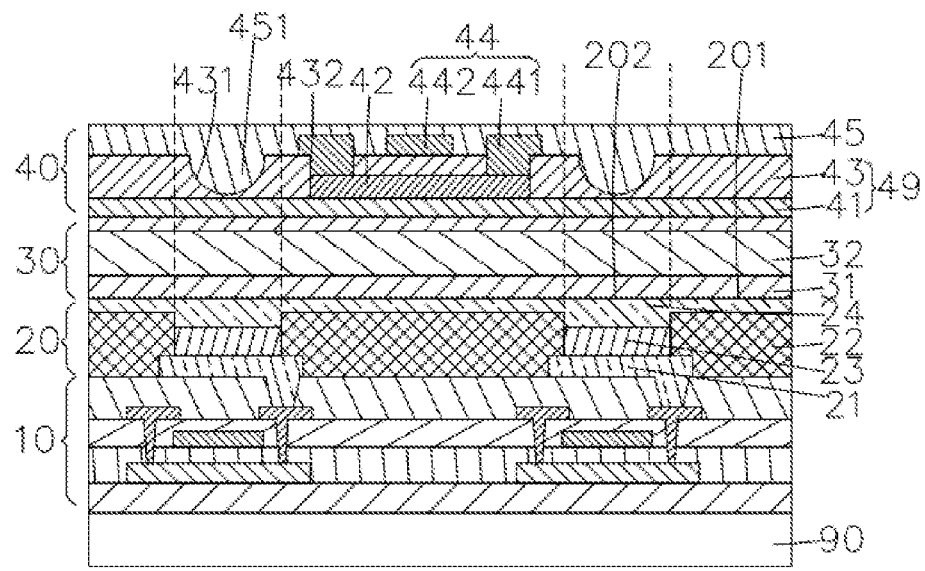
FIG. 1 is a schematic structural diagram of an organic light-emitting diode (OLED) touch display of a first embodiment of the present disclosure.

Referring to FIG. 1, which is a schematic structural diagram of an organic light-emitting diode (OLED) touch display of a first embodiment of the present disclosure. The embodiment includes a substrate 90 and a thin film transistor (TFT) layer 10, an OLED luminous layer 20, an encapsulation layer 30, and a touch functional layer 40, which are disposed on the substrate 90 in a sequence from bottom to top.

The touch functional layer 40 includes a first inorganic insulating layer 41 disposed on the encapsulation layer 30, a metal bridge layer 42 disposed on the first inorganic insulating layer 41, a second inorganic insulating layer 43 disposed on the first inorganic insulating layer 41 and covering the metal bridge layer 42, a metal mesh layer 44 disposed on the second inorganic insulating layer 43, and an organic protective layer 45 disposed on the second inorganic insulating layer 43 and covering the metal mesh layer 44.

The OLED luminous layer 20 has pixel spacing regions 201 and illuminated pixel regions 202 separated by the pixel spacing regions 201.

The metal bridge layer 42 and the metal mesh layer 44 are located above the pixel spacing regions 201, that is, the touch functional layer 40 adopts a metal mesh electrode structure, so that a metal touch electrode is separated from the illuminated pixel regions 202.

Specifically, material of the metal bridge layer 42 and the metal mesh layer 44 include titanium, aluminum, molybdenum, silver, and the like.

The first inorganic insulating layer 41 and the second inorganic insulating layer 43 together form an inorganic insulating layer 49. A surface of the inorganic insulating layer 49 contacting the organic protective layer 45 has a plurality of recesses 431 which are corresponding formed above the illuminated pixel regions 202. A surface of the organic protective layer 45 contacting the second inorganic insulating layer 43 has a plurality of protuberances 451, where the plurality of protuberances 451 are correspondingly embedded in the plurality of recesses 431. The organic protective layer 45 fills the plurality of recesses 431 of the inorganic insulating layer 49, so as to form the plurality of protuberance 451 correspondingly which match the plurality of recesses 432. The organic protective layer 45 corresponds to the protuberances above the illuminated pixel regions 202, and can effectively improve an optical coupling output rate of the OLED device.

Specifically, a depth of the recess 431 is smaller than a thickness of the second inorganic insulating layer 43, and the recess 431 is formed at the second inorganic insulating layer 43.

Specifically, the TFT layer 10 includes a buffer layer, an active layer, a gate insulating layer, a gate electrode layer, an interlayer insulating layer, a source and a drain electrode layer, and a planarization layer.

Specifically, the OLED luminous layer 20 includes an anode layer 21 disposed on the TFT layer 10, a pixel definition layer 22 disposed on the TFT layer 10 and the anode layer 21, an organic functional layer 23 disposed on the anode layer 21, and a cathode layer 24 disposed on the organic functional layer 23 and the pixel definition layer 22.

Specifically, pixel openings corresponding to the illuminated pixel regions 202 above the anode layer 21 are surrounded by the pixel definition layer 22. The organic functional layer 23 is formed within the pixel openings by inkjet printing an ink material. That is, the pixel definition layer 22 surrounds the organic functional layer 23 above the anode layer 21. The metal bridge layer 42 and the metal mesh layer 44 are correspondingly located above the pixel definition layer 22.

Specifically, the encapsulation layer 30 is a thin film encapsulation (TFE) layer structure, including an inorganic barrier layer 31 and an organic buffer layer 32 which are formed layer-by-layer.

Specifically, the inorganic barrier layer 31 is a stacked combination of one or more of a silicon oxide (SiOx) layer, a silicon nitride (SiNx) layer, and a silicon oxynitride (SiON) layer.

Furthermore, material of the organic protective layer 45 is the same as material of the organic buffer layer 32. Therefore, it can be fabricated by a process similar to the organic buffer layer 32 of the encapsulation layer 30 of the TFE structure, such as an inkjet printing (IJP) process, thereby omitting a mask process.

Specifically, material of the organic protective layer 45 includes at least one of acrylic acid, hexamethyldisiloxane, acrylate, polycarbonate, and polystyrene.

Specifically, the first inorganic insulating layer 41 and the second inorganic insulating layer 43 are stacked combinations of one or more of a silicon oxide layer, a silicon nitride layer, and a silicon oxynitride layer.

Specifically, the metal mesh layer 44 includes a plurality of first electrodes 441 and a plurality of second electrodes 442 alternatively disposed with the plurality of first electrodes 441. Each of the first electrodes 441 is disconnected from each of the second electrodes 442 at a staggered position of one of the first electrodes 441 and one of the second electrodes 442 on the second inorganic insulating layer 43.

The metal bridge layer 42 includes a plurality of metal bridges 421 which correspond to a position below the staggered position of the first electrode 441 and the second electrode 442.

Specifically, the second inorganic insulating layer 43 is provided with contacting holes 432 above two ends of each of the metal bridges 421. One of the first electrodes 441 is connected to one of the metal bridges 421 through one of the contacting holes 432, and each of the first electrodes 441 interrupted on the second inorganic insulating layer 43 is connected to one another by the metal bridges 421.

A first electrode 341 is one of a touch driving electrode and a touch sensing electrode, and a second electrode 342 is another one of a touch driving electrode and a touch sensing electrode.

In the OLED touch display of this embodiment, the touch functional layer 40 adopts a metal mesh electrode structure, and the metal bridge layer 42 and the metal mesh layer 44 are correspondingly located above the pixel spacing regions 201. The organic protective layer 45 has protuberances which are correspondingly formed above the illuminated pixel regions 202, and can effectively improve an optical coupling output rate of the OLED device. Moreover, the touch functional layer 40 adopts a structure in which the inorganic insulating layer 49 and the organic protective layer 45 are formed layer-by-layer, and the material and structure of which are similar to a thin film encapsulation (TFE) film layer, so the touch functional layer also functions as a film encapsulation layer. It is beneficial to block the penetration of water and oxygen, reduce a risk of corrosion damage of OLED light-emitting devices, and improve a lifespan of the OLED device.

Figure 2:
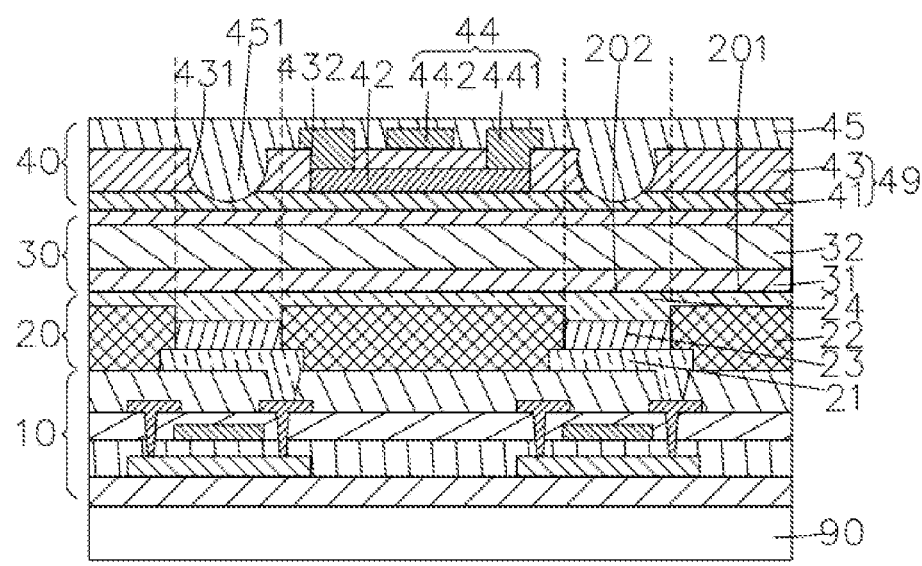
FIG. 2 is a schematic structural diagram of an OLED touch display of a second embodiment of the present disclosure.

Referring to FIG. 2, which is a schematic structural diagram of an OLED touch display of a second embodiment of the present disclosure. The second embodiment is different from the first embodiment in that the depth of the recess 431 is greater than the thickness of the second inorganic insulating layer 43, and the recess 431 extends through the second inorganic insulating layer 43 and extends to the first inorganic insulating layer 41. That is, the depth of the recess 431 is set to be deeper in the second embodiment, and the depth of the recess 431 is set to be shallower in the first embodiment. The other technical features are the same as those in the first embodiment, and are not described here again.

Figure 3:
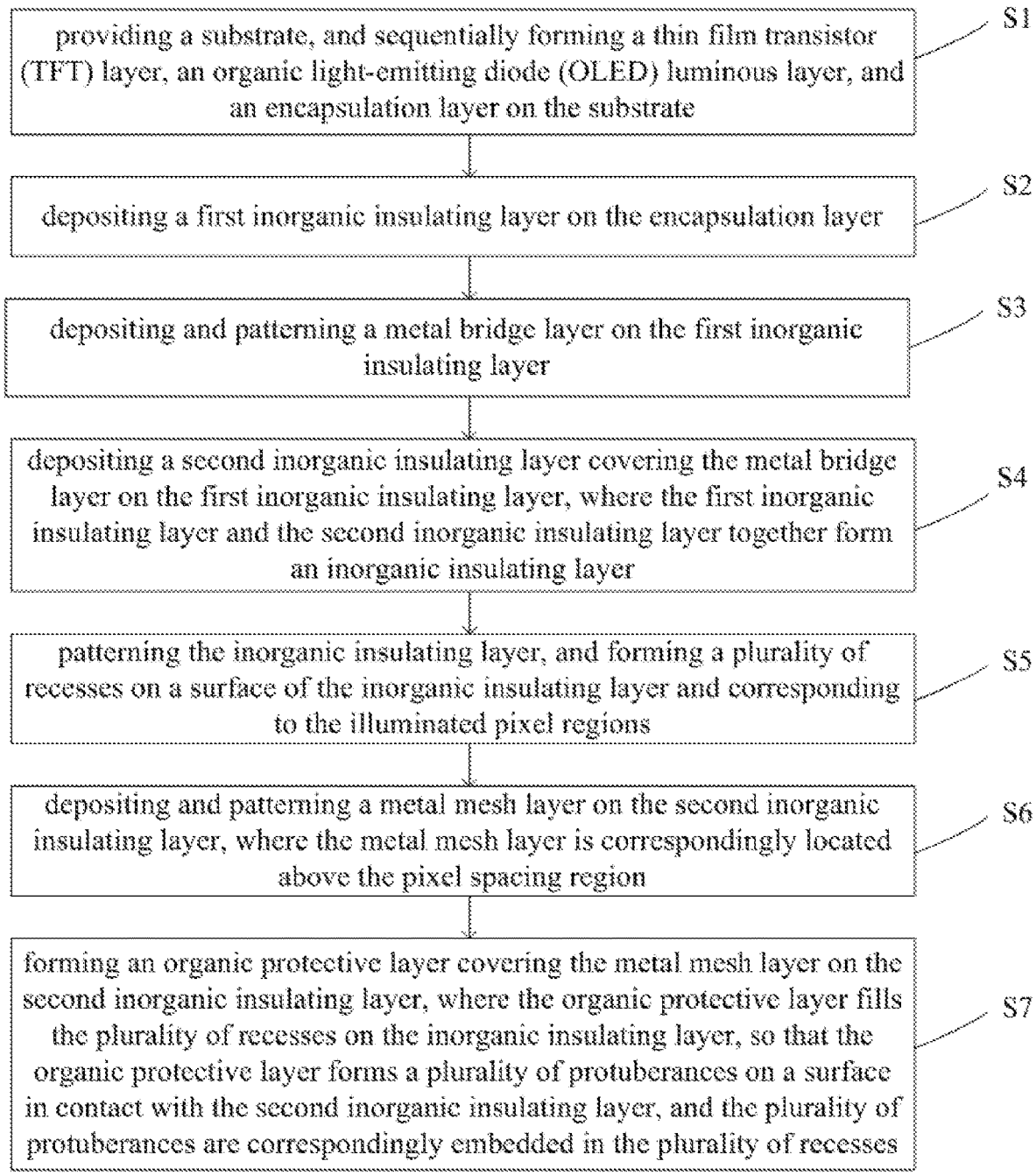
FIG. 3 is a flowchart of a manufacturing method of an OLED touch display of the present disclosure.

Referring to FIG. 3, based on the above OLED touch displays, the present disclosure also provides a manufacturing method of an OLED touch display, including the following steps.

Figure 4:
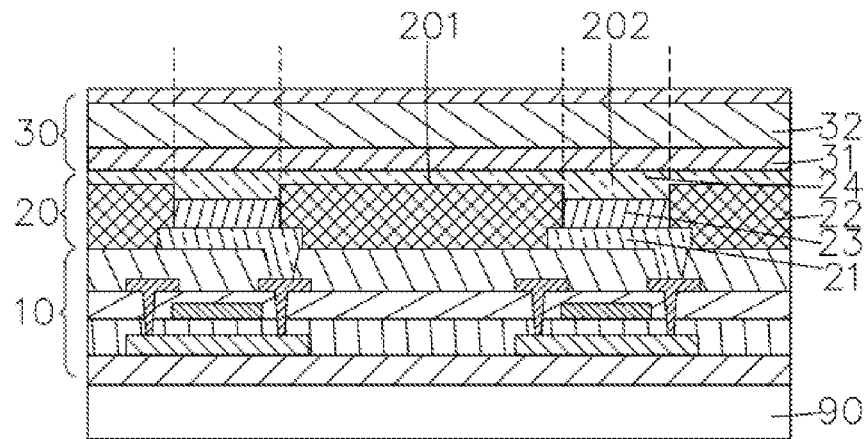
FIG. 4 is a schematic diagram showing an OLED touch display in step S1 of the manufacturing method of the present disclosure.

In a step S1, as shown in FIG. 4, a substrate 90 is provided. A thin film transistor (TFT) layer, an OLED luminous layer, and an encapsulation layer on the substrate are formed on the substrate 90 in a sequence from bottom to top.

Specifically, in the step S1, the TFT layer 10 includes a buffer layer, an active layer, a gate insulating layer, a gate electrode layer, an interlayer insulating layer, a source and a drain electrode layer, and a planarization layer.

Specifically, the OLED luminous layer 20 has pixel spacing regions 201 and illuminated pixel regions 202 separated by the pixel spacing regions 201.

Specifically, the OLED luminous layer 20 includes an anode layer 21 disposed on the TFT layer 10, a pixel definition layer 22 disposed on the TFT layer 10 and the anode layer 21, an organic functional layer 23 disposed on the anode layer 21, and a cathode layer 24 disposed on the organic functional layer 23 and the pixel definition layer 22.

Specifically, pixel openings corresponding to the illuminated pixel regions 202 above the anode layer 21 are surrounded by the pixel definition layer 22. The organic functional layer 23 is formed within the pixel openings by inkjet printing an ink material. That is, the pixel definition layer 22 surrounds the organic functional layer 23 above the anode layer 21.

Specifically, the encapsulation layer 30 is a thin film encapsulation (TFE) layer structure, including an inorganic barrier layer 31 and an organic buffer layer 32 which are formed layer-by-layer.

Specifically, the inorganic barrier layer 31 is a stacked combination of one or more of a silicon oxide layer, a silicon nitride layer, and a silicon oxynitride layer.

Specifically, the organic buffer layer 32 is formed by inkjet printing, and material thereof includes at least one of acrylic acid, hexamethyldisiloxane, acrylate, polycarbonate, and polystyrene.

Figure 5:
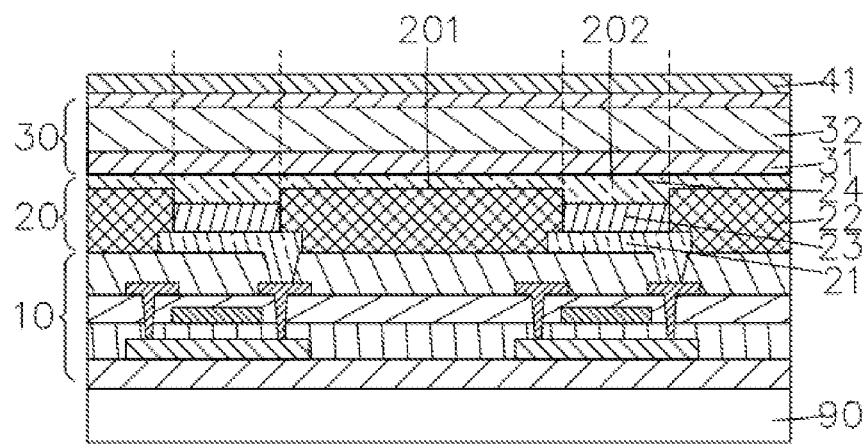
FIG. 5 is a schematic diagram showing the OLED touch display in step S2 of the manufacturing method of the present disclosure.

In a step S2, as shown in FIG. 5, a first inorganic insulating layer 41 is deposited on the encapsulation layer 30.

Specifically, the first inorganic insulating layer 41 is a stacked combination of one or more of a silicon oxide layer, a silicon nitride layer, and a silicon oxynitride layer.

Figure 6:
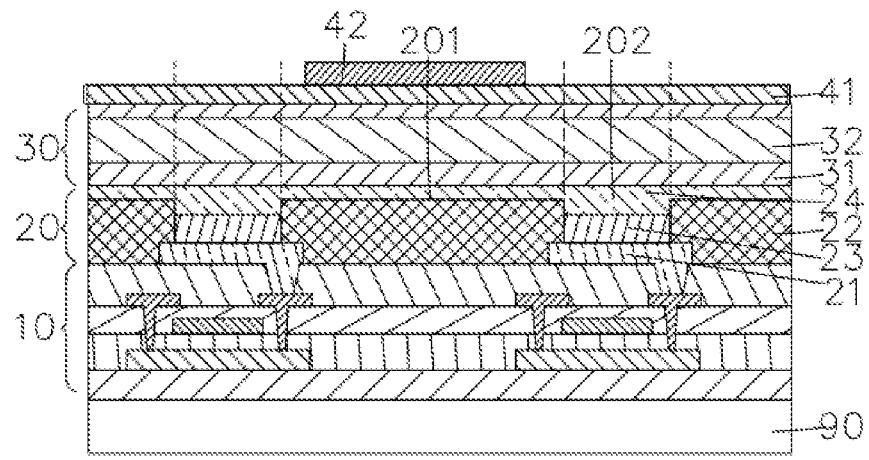
FIG. 6 is a schematic diagram showing the OLED touch display in step S3 of the manufacturing method of the present disclosure.

In a step S3, as shown in FIG. 6, a metal bridge layer 42 is deposited and patterned on the first inorganic insulating layer 41.

Specifically, the metal bridge layer 42 is correspondingly located above the pixel spacing regions 201, that is, the metal bridge layer 42 and the metal mesh layer 44 are correspondingly located above the pixel definition layer 22.

Specifically, material of the metal bridge layer 42 is titanium, aluminum, molybdenum, silver, and the like.

Figure 7:
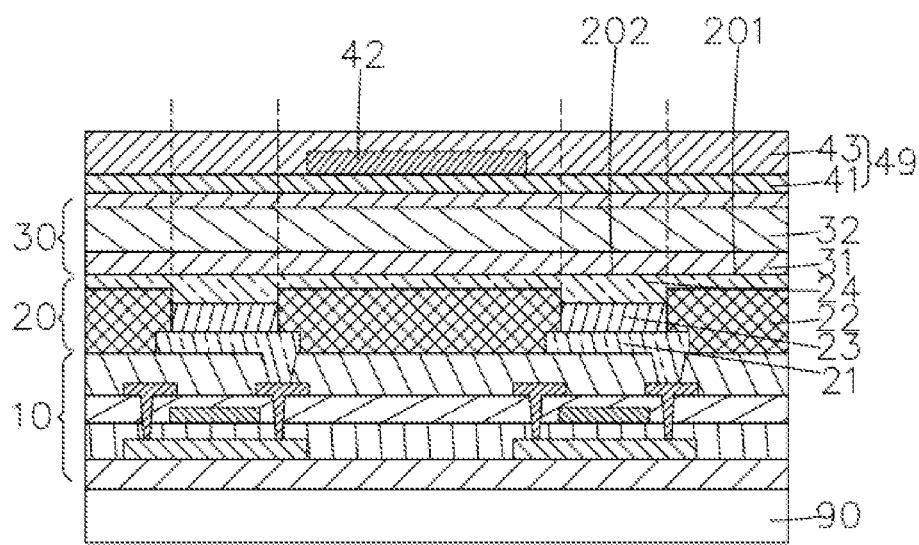
FIG. 7 is a schematic diagram showing the OLED touch display in step S4 of the manufacturing method of the present disclosure.

In a step S4, as shown in FIG. 7, a second inorganic insulating layer 43 covering the metal bridge layer 42 is deposited on the first inorganic insulating layer 41. The first inorganic insulating layer 41 and the second inorganic insulating layer 43 together form an inorganic insulating layer 49.

Specifically, the second inorganic insulating layer 43 is a stacked combination of one or more of a silicon oxide layer, a silicon nitride layer, and a silicon oxynitride layer.

Figure 8:
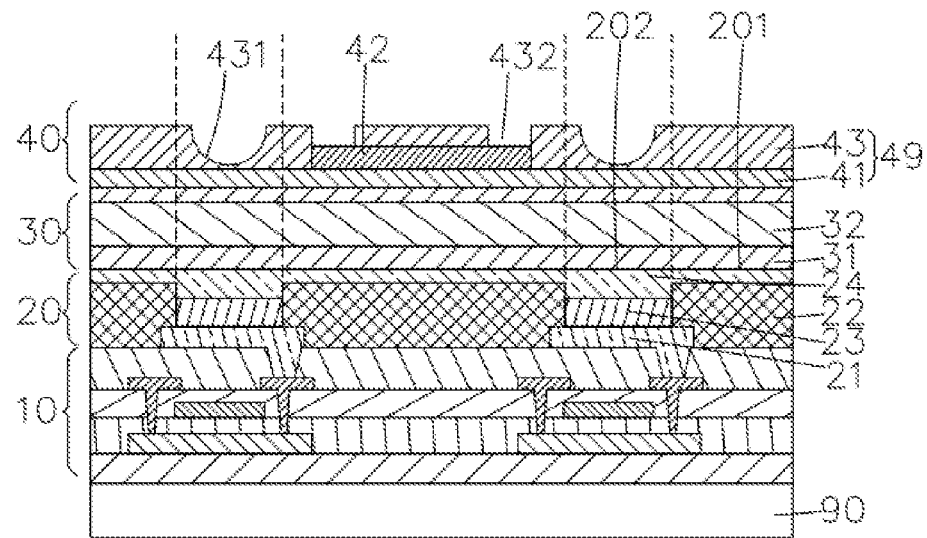
FIG. 8 is a schematic diagram showing the OLED touch display in step S5 of the manufacturing method of the present disclosure.

In a step S5, as shown in FIG. 8, the inorganic insulating layer 49 is patterned, and a plurality of recesses 431 are formed on a surface of the inorganic insulating layer 49 and corresponding to the illuminated pixel regions 202. Also, contact holes 432 through the second inorganic insulating layer 43 are formed on two ends of each of the metal bridges 421.

Specifically, in the step S5, a depth of the recess 431 is formed according to actual needs, which may be set shallower, and the depth of the recess 431 is less than a thickness of the second inorganic insulating layer 43. The recess 431 is formed in the second inorganic insulating layer 43.

Alternatively, in the step S5, the depth of the recess 431 is set deeper, the depth of the recess 431 is greater than the thickness of the second inorganic insulating layer 43. The recess 431 extends through the second inorganic insulating layer 43 and extends to the first inorganic insulating layer 41.

Specifically, specific processes of patterning the recesses 431 and the contact holes 432 in the step S5 include a photoresist coating step, an exposure step, a development step, an etching step, and a photoresist removal step, where the etching step of patterning the recesses 431 and the contact holes 432 is performed by dry etching.

Figure 9:
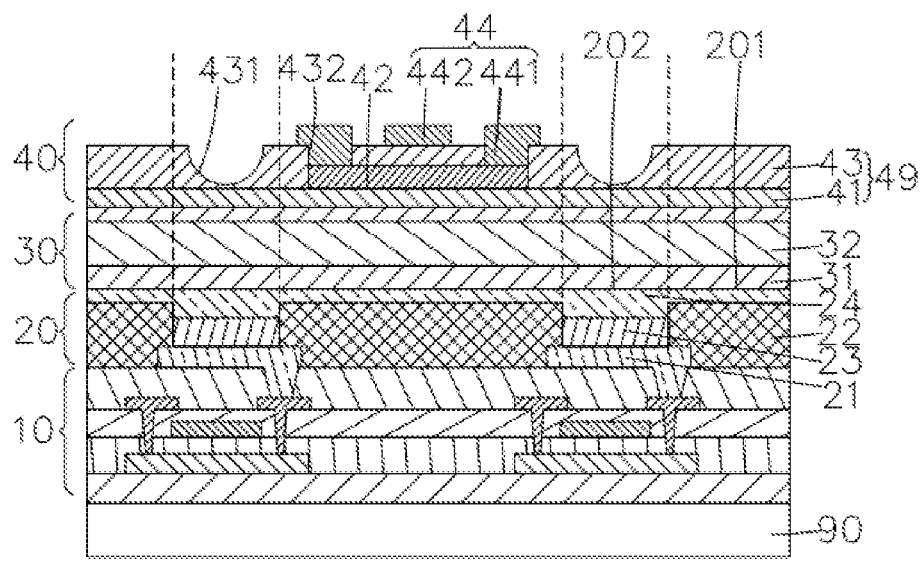
FIG. 9 is a schematic diagram showing the OLED touch display in step S6 of the manufacturing method of the present disclosure.

In a step S6, as shown in FIG. 9, the metal mesh layer is deposited and patterned on the second inorganic insulating layer 43, where the metal mesh layer 44 is correspondingly located above the pixel spacing regions 201.

Specifically, material of the metal mesh layer 44 is titanium, aluminum, molybdenum, silver and other metal materials.

Specifically, the metal mesh layer 44 includes a plurality of first electrodes 441 and a plurality of second electrodes 442 alternatively disposed with the plurality of first electrodes 441. Each of the first electrodes 441 is disconnected from each of the second electrodes 442 at a staggered position of one of the first electrodes 441 and one of the second electrodes 442 on the second inorganic insulating layer 43.

The plurality of metal bridges 421 correspond to a position below the staggered position of the first electrode 441 and the second electrode 442, and are configured to connect adjacent first electrodes 441 in a same line.

Specifically, one of the first electrodes 441 is connected to one of the metal bridges 421 through one of the contacting holes 432, and each of the first electrodes 441 interrupted on the second inorganic insulating layer 43 is connected to one another by the metal bridges 421.

The first electrode 341 is one of a touch driving electrode and a touch sensing electrode, and the second electrode 342 is another one of a touch driving electrode and a touch sensing electrode.

Specifically, the metal mesh layer 44 is correspondingly located above the pixel spacing regions 201. That is, the metal mesh layer 44 is correspondingly located above the pixel definition layer 22. The touch functional layer 40 adopts a metal mesh electrode structure, so that a metal touch electrode is separated from the illuminated pixel regions 202.

In a step S7, an organic protective layer 45 covering the metal mesh layer 44 is formed on the second inorganic insulating layer 43. The organic protective layer 45 fills the plurality of recesses 431 on the inorganic insulating layer 49, so that the organic protective layer 45 forms a plurality of protuberances 451 on a surface in contact with the second inorganic insulating layer 43, and the plurality of protuberances 451 are correspondingly embedded in the plurality of recesses 431. The touch functional layer 40, including the first inorganic insulating layer 41, the metal bridge layer 42, the second inorganic insulating layer 43, the metal mesh layer 44, and the organic protective layer 45, is obtained. The organic protective layer 45 corresponds to the protuberances above the illuminated pixel regions 202, which can effectively improve the optical coupling output rate of the OLED device, thereby obtaining the OLED touch displays as shown in FIG. 1 or FIG. 2.

Furthermore, material of the organic protective layer 45 is the same as material of the organic buffer layer 32 of the encapsulation layer 30. Therefore, it can be fabricated by a process similar to the organic buffer layer 32 of the encapsulation layer 30 of the TFE structure, such as an inkjet printing process, thereby omitting a mask process.

Specifically, the material of the organic protective layer 45 includes at least one of acrylic acid, hexamethyldisiloxane, acrylate, polycarbonate and polystyrene.

In the manufacturing method of the OLED touch display of the present disclosure, the touch functional layer 40 adopts a metal mesh electrode structure, and the metal bridge layer 42 and the metal mesh layer 44 of the touch functional layer 40 are correspondingly located above the pixel spacing regions 201. The organic protective layer 45 of the touch functional layer 40 has protuberances which are correspondingly formed above the illuminated pixel regions 202, and can effectively improve the optical coupling output rate of the OLED device. Moreover, the touch functional layer 40 adopts a structure in which the inorganic insulating layer 49 and the organic protective layer 45 are formed layer-by-layer, and the material and structure of which are similar to a thin film encapsulation (TFE) film layer, so the touch functional layer 40 also functions as a film encapsulation layer. It is beneficial to block the penetration of water and oxygen, reduce a risk of corrosion damage of OLED light-emitting devices, and improve a lifespan of the OLED device.

In summary, the OLED touch display of the present disclosure includes a substrate and a TFT layer, an OLED luminous layer, an encapsulation layer, and a touch functional layer which are sequentially formed on the substrate. The touch functional layer includes a first inorganic insulating layer, a metal bridge layer, a second inorganic insulating layer, a metal mesh layer, and an organic protective layer. The first inorganic insulating layer and the second inorganic insulating layer together form an inorganic insulating layer. A surface of the inorganic insulating layer contacting the organic protective layer has a plurality of recesses which are correspondingly formed above the illuminated pixel regions. A surface of the organic protective layer contacting the second inorganic insulating layer has a plurality of protuberances, where the plurality of protuberances are correspondingly embedded in the plurality of recesses. The touch functional layer adopts a metal mesh electrode structure, and the metal bridge layer and the metal mesh layer are correspondingly located above the pixel spacing region. The organic protective layer has protuberances which are correspondingly formed above the illuminated pixel regions, and can effectively improve an optical coupling output rate of the OLED device. Moreover, the touch functional layer adopts a structure in which the inorganic insulating layer and the organic protective layer are formed layer-by-layer, and the material and structure of which are similar to a thin film encapsulation (TFE) film layer, so the touch functional layer also functions as a film encapsulation layer. It is beneficial to block the penetration of water and oxygen, reduce a risk of corrosion damage of OLED light-emitting devices, and improve a lifespan of the OLED device. By the manufacturing method of the OLED touch display of the present disclosure, it is beneficial to improve an optical coupling output rate, block the penetration of water and oxygen, reduce a risk of corrosion damage of OLED light-emitting devices, and improve a lifespan of the OLED device.

Any modification or replacement can be made by those skilled in the art in light of the technical scope and technical concept of the present disclosure, and all such modification or replacement should fall within the protection scope of the present disclosure.

What is claimed is:

1. An organic light-emitting diode (OLED) touch display, comprising: a substrate, a thin film transistor (TFT) layer, an OLED luminous layer, an encapsulation layer, and a touch functional layer, which are sequentially formed on the substrate;
   wherein the touch functional layer comprises a first inorganic insulating layer disposed on the encapsulation layer, a metal bridge layer disposed on the first inorganic insulating layer, a second inorganic insulating layer disposed on the first inorganic insulating layer and covering the metal bridge layer, a metal mesh layer disposed on the second inorganic insulating layer, and an organic protective layer disposed on the second inorganic insulating layer and covering the metal mesh layer;
   wherein the OLED luminous layer has a pixel spacing region and illuminated pixel regions separated by the pixel spacing region;
   wherein the metal bridge layer and the metal mesh layer are correspondingly located above the pixel spacing region; and
   wherein the first inorganic insulating layer and the second inorganic insulating layer together form an inorganic insulating layer, and a surface of the second inorganic insulating layer contacting the organic protective layer has a plurality of recesses which are correspondingly formed above the illuminated pixel regions, the organic protective layer fills the plurality of recesses on the second inorganic insulating layer, and a surface of the organic protective layer contacting the second inorganic insulating layer has a plurality of protuberances, wherein the plurality of protuberances are correspondingly embedded in the plurality of recesses.

2. The OLED touch display as claimed in claim 1, wherein a depth of one of the recesses is less than a thickness of the second inorganic insulating layer, and the one of the recesses is disposed in the second inorganic insulating layer.

3. The OLED touch display as claimed in claim 1, wherein a depth of one of the recesses is greater than a thickness of the second inorganic insulating layer, and the one of the recesses extends through the second inorganic insulating layer and extends to the first inorganic insulating layer.

4. The OLED touch display as claimed in claim 1, wherein the encapsulation layer comprises an inorganic barrier layer and an organic buffer layer which are formed layer-by-layer; material of the organic protective layer is the same as material of the organic buffer layer; and the material of the organic protective layer comprises at least one of acrylic acid, hexamethyldisiloxane, acrylate, polycarbonate, and polystyrene.

5. The OLED touch display as claimed in claim 1, wherein the metal mesh layer comprises a plurality of first electrodes and a plurality of second electrodes alternatively disposed with the plurality of first electrodes, each of the first electrodes is disconnected from each of the second electrodes at a staggered position of one of the first electrodes and one of the second electrodes on the second inorganic insulating layer;
   the metal bridge layer comprises a plurality of metal bridges which correspond to a position below the staggered position of the first electrode and the second electrode;
   the second inorganic insulating layer is provided with contacting holes above two ends of each of the metal bridges; and
   one of the first electrodes is connected to one of the metal bridges through one of the contacting holes, and each of the first electrodes interrupted on the second inorganic insulating layer is connected to one another by the metal bridges.

6. A manufacturing method of an organic light-emitting diode (OLED) touch display, comprising:
   in a step S1, providing a substrate, and sequentially forming a thin film transistor (TFT) layer, an OLED luminous layer, and an encapsulation layer on the substrate,
   wherein the OLED luminous layer has a pixel spacing region and illuminated pixel regions separated by the pixel spacing region;
   in a step S2, depositing a first inorganic insulating layer on the encapsulation layer;
   in a step S3, depositing and patterning a metal bridge layer on the first inorganic insulating layer;
   in a step S4, depositing a second inorganic insulating layer covering the metal bridge layer on the first inorganic insulating layer, wherein the first inorganic insulating layer and the second inorganic insulating layer together form an inorganic insulating layer;
   in a step S5, patterning the inorganic insulating layer, and forming a plurality of recesses on a surface of the second inorganic insulating layer and corresponding to the illuminated pixel regions;
   in a step S6, depositing and patterning a metal mesh layer on the second inorganic insulating layer, wherein the metal mesh layer is correspondingly located above the pixel spacing region; and
   in a step S7, forming an organic protective layer covering the metal mesh layer on the second inorganic insulating layer, wherein the organic protective layer fills the plurality of recesses on the surface of the second inorganic insulating layer, so that the organic protective layer forms a plurality of protuberances on a surface in contact with the second inorganic insulating layer, and the plurality of protuberances are correspondingly embedded in the plurality of recesses.

7. The manufacturing method of the OLED touch display as claimed in claim 6, wherein in the step S5, a depth of one of the recesses is less than a thickness of the second inorganic insulating layer, and the one of the recesses is disposed in the second inorganic insulating layer.

8. The manufacturing method of the OLED touch display as claimed in claim 6, wherein in the step S5, a depth of one of the recesses is greater than a thickness of the second inorganic insulating layer, and the one of the recesses extends through the second inorganic insulating layer and extends to the first inorganic insulating layer.

9. The manufacturing method of the OLED touch display as claimed in claim 6, wherein in the step S1, the encapsulation layer comprises an inorganic barrier layer and an organic buffer layer which are formed layer-by-layer;
in the step S7, material of the organic protective layer is the same as material of the organic buffer layer; and
the material of the organic protective layer comprises at least one of acrylic acid, hexamethyldisiloxane, acrylate, polycarbonate, and polystyrene.

10. The manufacturing method of the OLED touch display as claimed in claim 6, wherein in the step S3, the metal bridge layer comprises a plurality of metal bridges;
in the step S5, the method further comprises forming contacting holes passing through the second inorganic insulating layer above two ends of each of the metal bridges; and
in the step S6, the metal mesh layer comprises a plurality of first electrodes and a plurality of second electrodes alternatively disposed with the plurality of first electrodes, each of the first electrodes is disconnected from each of the second electrodes at a staggered position of one of the first electrodes and one of the second electrodes on the second inorganic insulating layer;
the metal bridges correspond to a position below the staggered position of the first electrode and the second electrode; and
one of the first electrodes is connected to one of the metal bridges through one of the contacting holes, and each of the first electrodes interrupted on the second inorganic insulating layer is connected to one another by the metal bridges.

\* \* \* \* \*